United States Patent
Suh et al.

(10) Patent No.: US 11,417,648 B2
(45) Date of Patent: Aug. 16, 2022

(54) INTELLIGENT POWER MODULE CONTAINING IGBT AND SUPER-JUNCTION MOSFET

(71) Applicant: ALPHA AND OMEGA SEMICONDUCTOR INTERNATIONAL LP, Sunnyvale, CA (US)

(72) Inventors: Bum-Seok Suh, Seongnam (KR); Madhur Bobde, Sunnyvale, CA (US); Zhiqiang Niu, Santa Clara, CA (US); Junho Lee, Suwon-si (KR); Xiaojing Xu, Shanghai (CN); Zhaorong Zhuang, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 93 days.

(21) Appl. No.: 17/093,097

(22) Filed: Nov. 9, 2020

(65) Prior Publication Data

US 2021/0098448 A1     Apr. 1, 2021

Related U.S. Application Data

(63) Continuation-in-part of application No. 16/585,437, filed on Sep. 27, 2019, now Pat. No. 10,931,276, and (Continued)

(51) Int. Cl.
| | |
|---|---|
| *H01L 27/06* | (2006.01) |
| *H02K 11/33* | (2016.01) |
| *H01L 29/06* | (2006.01) |
| *H01L 23/00* | (2006.01) |
| *H01L 23/31* | (2006.01) |

(52) U.S. Cl.
CPC ...... *H01L 27/0635* (2013.01); *H01L 23/3107* (2013.01); *H01L 24/05* (2013.01); *H01L 24/13* (2013.01); *H01L 24/45* (2013.01); *H01L 29/0634* (2013.01); *H02K 11/33* (2016.01);
(Continued)

(58) Field of Classification Search
CPC . H01L 27/0635; H01L 23/3107; H01L 24/05; H01L 24/13; H01L 24/45; H01L 29/0634; H01L 2924/13055; H01L 2924/13091
See application file for complete search history.

(56) References Cited

U.S. PATENT DOCUMENTS

2019/0006270 A1\*   1/2019   Niu ............... H01L 23/49575

\* cited by examiner

*Primary Examiner* — Latanya N Crawford Eason
(74) *Attorney, Agent, or Firm* — Chen-Chi Lin

(57) ABSTRACT

An intelligent power module (IPM) comprises a first, second, third and fourth die supporting elements, a first group of insulated gate bipolar transistors (IGBTs), a second group of IGBTs, a first group of super-junction metal-oxide-semiconductor field-effect transistors (MOSFETs), a second group of super-junction MOSFETs, a fifth die supporting element, a low voltage IC, a high voltage IC, and a molding encapsulation. The low and high voltage ICs are attached to the fifth die supporting element. The molding encapsulation encloses the first, second, third and fourth die supporting elements, the first group of IGBTs, the second group of IGBTs, the first group of super-junction MOSFETs, the second group of super-junction MOSFETs, the fifth die supporting element, the low voltage IC, the high voltage IC.

20 Claims, 5 Drawing Sheets

Related U.S. Application Data a continuation-in-part of application No. 16/585,388, filed on Sep. 27, 2019.

(52) U.S. Cl.
CPC ............... *H01L 2924/13055* (2013.01); *H01L 2924/13091* (2013.01)

INTELLIGENT POWER MODULE CONTAINING IGBT AND SUPER-JUNCTION MOSFET

CROSS-REFERENCE TO RELATED APPLICATIONS

This patent application is a Continuation-in-part application of a pending patent application Ser. No. 16/585,388 filed on Sep. 27, 2019. This patent application is a Continuation-in-part application of a pending patent application Ser. No. 16/585,437 filed on Sep. 27, 2019 The disclosure made in the patent application Ser. No. 16/585,388 and the disclosure made in patent application Ser. No. 16/585,437 are hereby incorporated by reference.

FIELD OF THE INVENTION

This invention relates generally to a molded intelligent power module (IPM) for driving a motor. More particularly, the present invention relates to a molded IPM containing insulated gate bipolar transistors (IGBTs) and super-junction metal-oxide-semiconductor field-effect transistors (MOSFETs).

BACKGROUND OF THE INVENTION

Pending patent application Ser. No. 16/585,388 and pending patent application Ser. No. 16/585,437 disclose an apparatus comprising electrically coupled IGBPs and MOSFETS. It would be advantages to facilitate configuring an IGBT package having high conductivity at low temperature and having excellent reverse current conduction characteristics.

Conventional IPMs include fast recovery diodes (FRDs). FRDs are replaced by super-junction MOSFETs in present disclosure. Advantages of the IPM of the present disclosure include higher efficiency satisfying the requirement for a higher energy efficiency label, a wide operating power capability in a high ambient temperature environment, improved reliability performance, and efficient package design and implementation.

SUMMARY OF THE INVENTION

The present invention discloses an IPM having a plurality of separated die supporting elements, a first group of IGBTs, a second group of IGBTs, a first group of super-junction MOSFETs, a second group of super-junction MOSFETs, a low voltage IC, a high voltage IC, and a molding encapsulation. The low voltage ICs connects to the first group of IGBTs and the first group of super-junction MOSFETs, the high voltage ICs connects to the second group of IGBTs and the second group of super-junction MOSFETs. The molding encapsulation encloses the plurality of separated die supporting elements, the first group of IGBTs, the second group of IGBTs, the first group of super-junction MOSFETs, the second group of super-junction MOSFETs, the low voltage IC, the high voltage IC.

In one example, wires are bonded by a ball stitch on ball (BSOB) method. In another example, wires are bonded by a bridge bonding method.

DETAILED DESCRIPTION OF THE INVENTION

Figure 1:
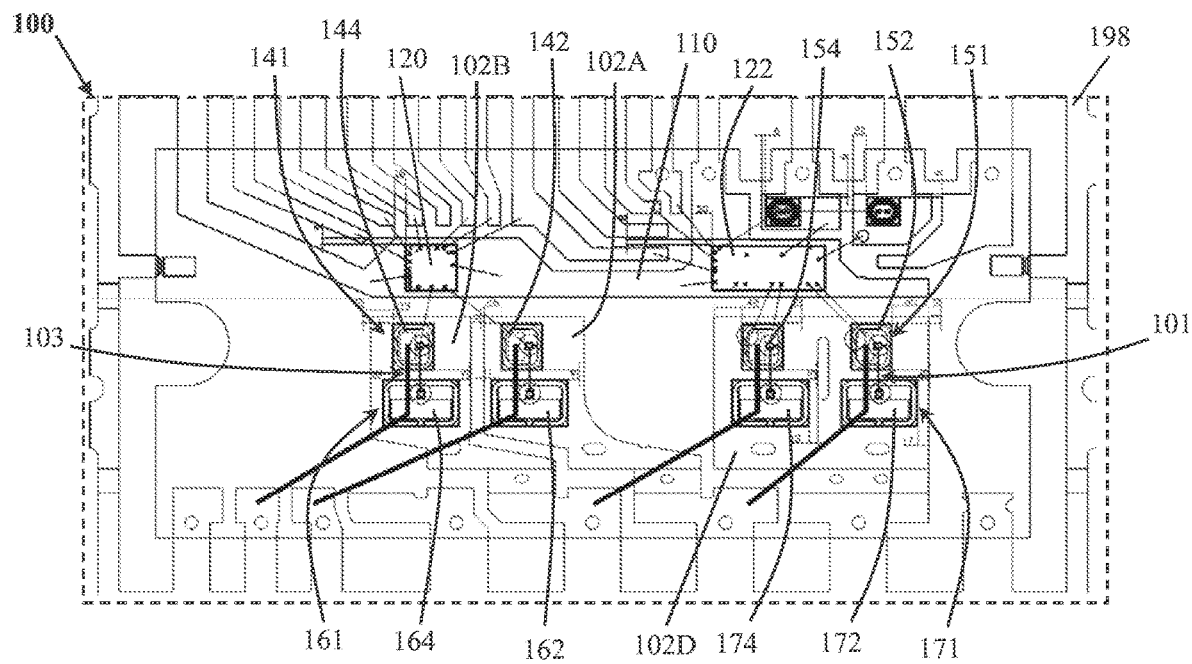
FIG. 1 is a top view of an intelligent power module (IPM) in examples of the present disclosure.

FIG. 1 is a top view of an intelligent power module (IPM) 100 in examples of the present disclosure. The IPM 100 has a die supporting element 102A, a die supporting element 102B, a die supporting element 102D, a die supporting element 110, a first group of insulated gate bipolar transistors (IGBTs) 141, a second group of IGBTs 151, a first group of super-junction metal-oxide-semiconductor field-effect transistors (MOSFETs) 161, a second group of super-junction MOSFETs 171, a low voltage integrated circuit (IC) 120, a high voltage IC 122, and a molding encapsulation 198 (shown as transparent as in dashed lines).

The die supporting element 102A, the die supporting element 102B, and the die supporting element 102D are separated from each other and arranged one by one next each other in sequence with one edge (upper edge) of each die supporting element aligned substantially in a line. The die supporting element 110 is separated from the die supporting elements 102A, 102B and 102D. A majority of the die supporting element 110 extends along the aligned edges of the die supporting elements 102A. 102B and 102D.

The first group of IGBTs 141 comprises a first IGBT 142 with a bottom collector electrode conductively attached to the die supporting element 102A and a second IGBT 144 with a bottom collector electrode conductively attached to the die supporting element 102B. The second group of IGBTs 151 comprises a first IGBT 152 with a bottom collector electrode conductively attached to the die supporting element 102D and a second IGBT 154 with a bottom collector electrode conductively attached to the die supporting element 102D.

The first group of super-junction MOSFETs 161 comprises a first super-junction MOSFET 162 with a bottom drain electrode conductively attached to the die supporting element 102A and a second super-junction MOSFET 164 with a bottom drain electrode conductively attached to the die supporting element 102B. The second group of super-junction MOSFETs 171 comprises a first super-junction MOSFET 172 with a bottom drain electrode conductively attached to the die supporting element 102D and a second super-junction MOSFET 174 with a bottom drain electrode conductively attached to the die supporting element 102D. In a preferred example of the invention, the first super-junction MOSFET 162 and the second super-junction MOSFET 164 of the first group of super-junction MOSFETs 161 are respectively connected in parallel to the first IGBT 142 and the second IGBT 144 of the first group of IGBTs 141. In another preferred example of the invention, the first super-junction MOSFET 172 and the second super-junction MOSFET 174 of the second group of super-junction MOSFETs 171 are respectively connected in parallel to the first IGBT 152 and the second IGBT 154 of the first group of IGBTs 151. A super-junction MOSFET connected in parallel to an IGBT means a gate electrode, a source electrode and a drain electrode of the super-junction MOSFET being respectively connected to a gate electrode, an emitter electrode and a collector electrode of the IGBT. In the example shown FIG. 1, the gate electrode of each super-junction MOSFET is connected to a gate electrode of a corresponding IGBT disposed on the same die supporting element by a bond wire 101 with a size ranging from 0.7 mil to 3 mils (17.8 microns to 76.2 microns). The source electrode of each super-junction MOSFET is connected to an emitter electrode of a corresponding IGBT disposed on the same die supporting element by a connection member 103, such as a bond wire, a ribbon, or a conductive clip. The connection member 103 has a size in a range between 5 mils to 20 mils (127 microns to 508 microns). Preferably, the size of connection member 103 is at least 5 times larger than the bond wire 101.

The low voltage IC 120 is electrically connected to a gate of the first IGBT 142 of the first group of IGBTs 141 and a gate of the second IGBT 144 of the first group of IGBTs 141. The high voltage IC 122 is electrically connected to a gate of the first IGBT 152 of the second group of IGBTs 151 and a gate of the second IGBT 154 of the second group of IGBTs 151.

The molding encapsulation 198 encloses the die supporting elements 102A, 102B, and 102D, the first group of IGBTs 141, the second group of IGBTs 151, the first group of super-junction MOSFETs 161, the second group of super-junction MOSFETs 171, the die supporting element 110, the low voltage IC 120, and the high voltage IC 122.

The die supporting elements may be of a die attach pad (DAP) type or a direct bonded copper (DBC) type. In examples of the present disclosure, the die supporting element 102A is a die attach pad (DAP). The die supporting element 102B is a DAP. The die supporting element 102D is a DAP.

The low voltage IC 120 is disposed on the die supporting element 110 adjacent to die supporting elements 102A and 102B, and the high voltage IC 122 is disposed on the die supporting element 110 adjacent to die supporting elements 102D. In examples of the present disclosure, the low voltage IC 120 and the high voltage IC 122 are directly attached to the die supporting element 110.

Figure 2:
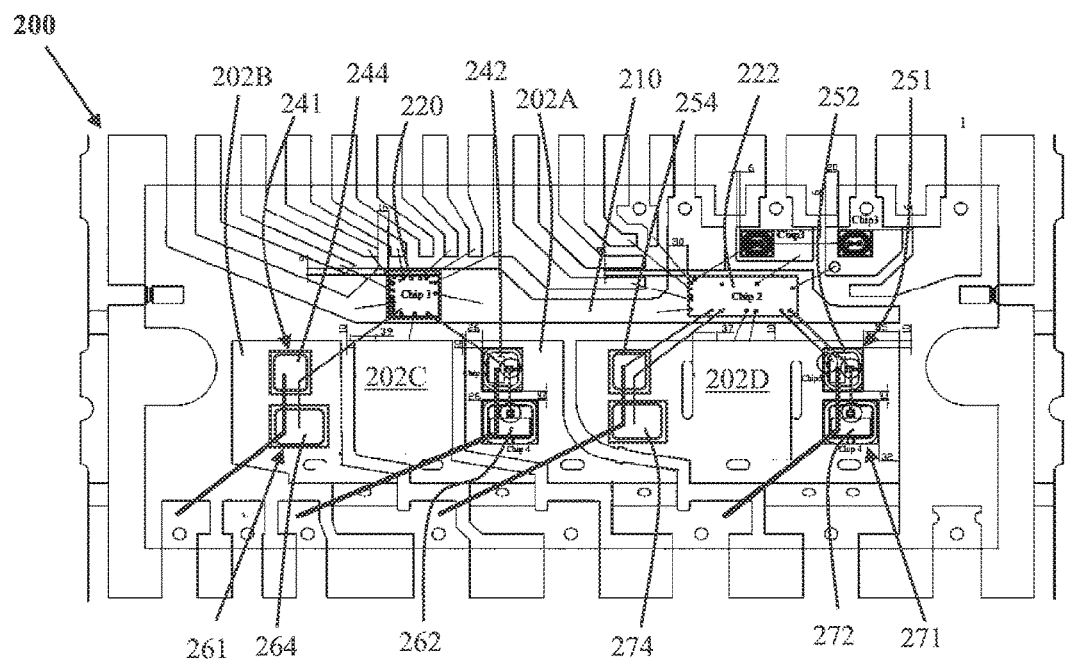
FIG. 2 is a top view of another IPM in examples of the present disclosure.

FIG. 2 is a top view of an IPM 200 in examples of the present disclosure. The IPM 200 has a die supporting element 202A, a die supporting element 202B, a die supporting element 202C, a die supporting element 202D, a die supporting element 210, a first group of IGBTs 241, a second group of IGBTs 251, a first group of super-junction MOSFETs 261, a second group of super-junction MOSFETs 271, a low voltage IC 220, and a high voltage IC 222.

The first group of IGBTs 241 comprises a first IGBT 242 attached to the die supporting element 202A and a second IGBT 244 attached to the die supporting element 202B. The second group of IGBTs 251 comprises a first IGBT 252 attached to the die supporting element 202D and a second IGBT 254 attached to the die supporting element 202D.

The first group of super-junction MOSFETs 261 comprises a first super-junction MOSFET 262 attached to the die supporting element 202A and a second super-junction MOSFET 264 attached to the die supporting element 202B. The second group of super-junction MOSFETs 271 comprises a first super-junction MOSFET 272 attached to the die supporting element 202D and a second super-junction MOSFET 274 attached to the die supporting element 202D.

The low voltage IC 220 is electrically connected to a gate of the first IGBT 242 of the first group of IGBTs 241 and a gate of the second IGBT 244 of the first group of IGBTs 241. The high voltage IC 222 is electrically connected to a gate of the first IGBT 252 of the second group of IGBTs 251 and a gate of the second IGBT 254 of the second group of IGBTs 251.

The low voltage IC 220 is disposed on the die supporting element 210 adjacent to die supporting elements 202A, 202B and 202C, and the high voltage IC 222 is disposed on the die supporting element 210 adjacent to die supporting elements 202D. In examples of the present disclosure, the low voltage IC 220 and the high voltage IC 222 are directly attached to the die supporting element 210. The IPM 200 shown in FIG. 2 is similar to the IPM100 shown in FIG. 1, except that the IPM200 comprises an optional die supporting element 202C and no IGBTs nor super-junction MOSFETs are attached to the die supporting element 202C. Alternatively, one of the die supporting elements 202A or 202B may be selected as the optional die supporting element with no IGBTs nor super-junction MOSFETs are attached thereto. This provide the advantage of flexibility and cost saving for IPM modules of different lead configurations sharing a same lead frame.

Figure 3:
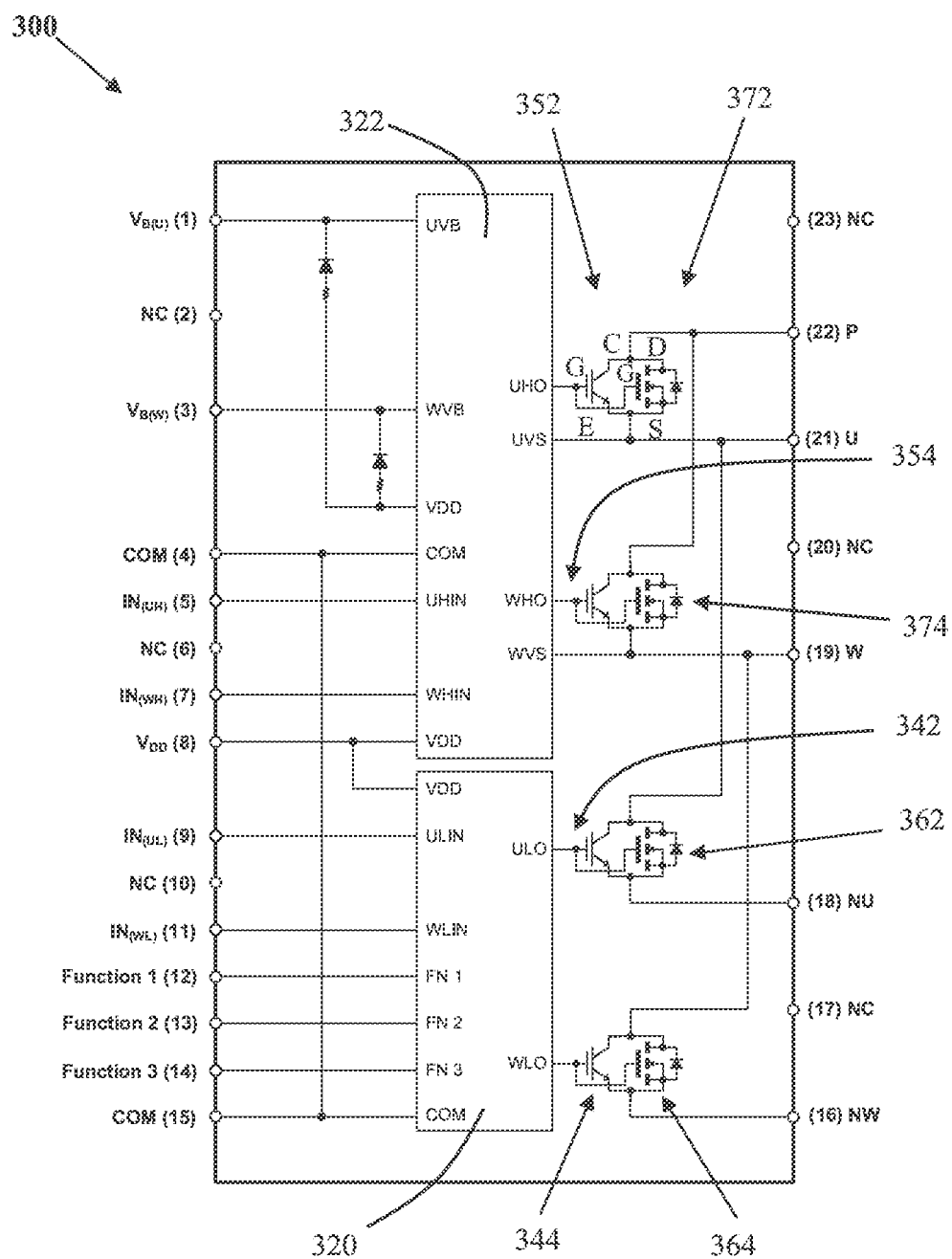
FIG. 3 is a circuit diagram of the IPM of FIG. 1 for driving a motor in examples of the present disclosure.

FIG. 3 is a circuit diagram 300 of the IPM 100 of FIG. 1 and IPM 200 of FIG. 2 for driving a motor in examples of the present disclosure. It is a 2-phase, bootstrap circuit, full-bridge inverter IPM including four gate driver channels for eight active devices. A low voltage IC 320 controls a first IGBT 342 and a second IGBT 344 of a first group of IGBTs. A high voltage IC 322 controls a first IGBT 352 and a second IGBT 354 of a second group of IGBTs.

A drain electrode D of a first super-junction MOSFET 372 and a drain electrode of a second super-junction MOSFET 374 of a second group super-junction MOSFETs are electrically connected. A drain electrode of a first super-junction MOSFET 362 of a first group super-junction MOSFETs is electrically connected to a source electrode of the first super-junction MOSFET 372 of the second group super-junction MOSFETs. A drain electrode of a second super-junction MOSFET 364 of the first group super-junction MOSFETs is electrically connected to the source electrode of the fourth super-junction MOSFET 374 of the second group super-junction MOSFETs. In the examples shown in FIG. 1, FIG. 2 and FIG. 3, a source electrode of the first super-junction MOSFET 362 and a source electrode of the second super-junction MOSFET 364 of the first group super-junction MOSFETs are electrically isolated. In an alternative example, the source electrode of the first super-junction MOSFET 362 and the source electrode of the second super-junction MOSFET 364 of the first group super-junction MOSFETs are electrically connected (not shown).

Figure 4:
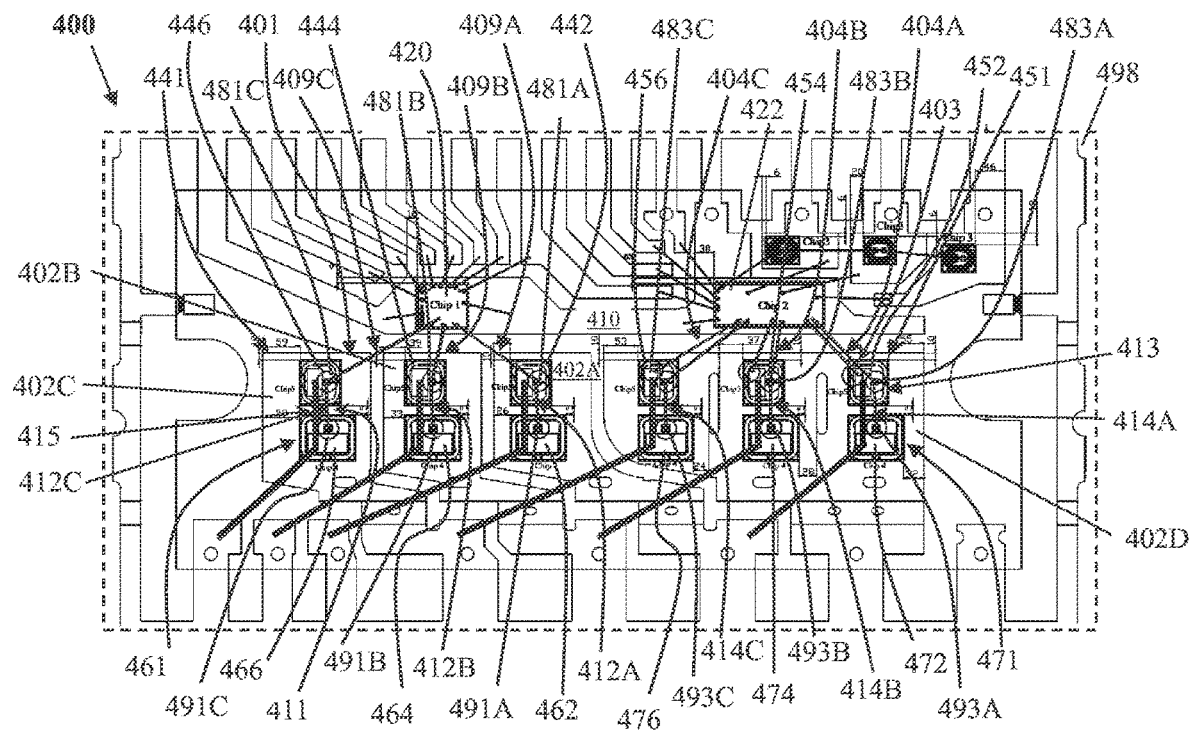
FIG. 4 is a top view of still another IPM in examples of the present disclosure.

FIG. 4 is a top view of an IPM 400 in examples of the present disclosure. The IPM 400 has a die supporting element 402A, a die supporting element 402B, a die supporting element 402C, a die supporting element 402D, a die supporting element 410, a first group of IGBTs 441, a second group of IGBTs 451, a first group of super-junction MOSFETs 461, a second group of super-junction MOSFETs 471, a low voltage integrated circuit (IC) 420, a high voltage IC 422, and a molding encapsulation 498 (shown as transparent as in dashed lines).

The die supporting element 402A, the die supporting element 402B, the die supporting element 402C, and the die supporting element 402D are separated from each other and arranged one by one next each other in sequence with one edge (upper edge) of each die supporting element aligned substantially in a line. The die supporting element 410 is separated from the die supporting elements 402A, 402B, 402C and 402D. A majority of the die supporting element 410 extends along the aligned edges of the die supporting elements 402A, 402B, 402C and 402D.

The first group of IGBTs 441 comprises a first IGBT 442 with a bottom collector electrode conductively attached to the die supporting element 402A, a second IGBT 444 with a bottom collector electrode conductively attached to the die supporting element 402B, and a third IGBT 446 with a bottom collector electrode conductively attached to the die supporting element 402C. The second group of IGBTs 451 comprises a first IGBT 452 with a bottom collector electrode conductively attached to the die supporting element 402D, a second IGBT 454 with a bottom collector electrode conductively attached to the die supporting element 102D, and a third IGBT 456 with a bottom collector electrode conductively attached to the die supporting element 102D.

The first group of super-junction MOSFETs 461 comprises a first super-junction MOSFET 462 with a bottom drain electrode conductively attached to the die supporting element 402A, a second super-junction MOSFET 464 with a bottom drain electrode conductively attached to the die supporting element 402B, and a third super-junction MOSFET 466 with a bottom drain electrode conductively attached to the die supporting element 402C. The second group of super-junction MOSFETs 471 comprises a first super-junction MOSFET 472 with a bottom drain electrode conductively attached to the die supporting element 402D, a second super-junction MOSFET 474 with a bottom drain electrode conductively attached to the die supporting element 402D, and a third super-junction MOSFET 476 with a bottom drain electrode conductively attached to the die supporting element 402D. In a preferred example of the invention, each super-junction MOSFET of the first group of super-junction MOSFETs 461 is connected in parallel to a corresponding IGBT of the first group of IGBTs 441 disposed on a same die supporting element. In another preferred example of the invention, each super-junction MOSFET of the second group of super-junction MOSFETs 471 is connected in parallel to a corresponding IGBT of the second group of IGBTs 451 disposed on the same die supporting element.

The low voltage IC 420 is electrically connected to a gate of the first IGBT 442 of the first group of IGBTs 441, a gate of the second IGBT 444 of the first group of IGBTs 441, and a gate of the third IGBT 446 of the first group of IGBTs 441. The high voltage IC 422 is electrically connected to a gate of the first IGBT 452 of the second group of IGBTs 451, a gate of the second IGBT 454 of the second group of IGBTs 451, and a gate of the third IGBT 456 of the second group of IGBTs 451.

The molding encapsulation 498 encloses the die supporting elements 402A, 402B, 402C, and 402D, the first group of IGBTs 441, the second group of IGBTs 451, the first group of super-junction MOSFETs 461, the second group of super-junction MOSFETs 471, the die supporting element 410, the low voltage IC 420, and the high voltage IC 422.

The die supporting elements may be of a die attach pad (DAP) type or a direct bonded copper (DBC) type. In examples of the present disclosure, the first die supporting element 402A is a first die attach pad (DAP). The second die supporting element 402B is a second DAP. The third die supporting element 402C is a third DAP. The fourth die supporting element 402D is a fourth DAP.

The low voltage IC 420 is disposed on the die supporting element 410 adjacent to die supporting elements 402A, 402B and 402C, and the high voltage IC 422 is disposed on the die supporting element 410 adjacent to die supporting elements 402D. In examples of the present disclosure, the low voltage IC 420 and the high voltage IC 422 are directly attached to the die supporting element 410.

In examples of the present disclosure, single gate pad is used. The first IGBT 442 of the first group of IGBTs 441 comprises a single gate pad 481A. The second IGBT 444 of the first group of IGBTs 441 comprises a single gate pad 481B. The third IGBT 446 of the first group of IGBTs 441 comprises a single gate pad 481C. The first IGBT 452 of the second group of IGBTs 451 comprises a single gate pad 483A. The second IGBT 454 of the second group of IGBTs 451 comprises a single gate pad 483B. The third IGBT 456 of the second group of IGBTs 451 comprises a single gate pad 483C.

The first super-junction MOSFET 462 of the first group of super-junction MOSFETs 461 comprises a single gate pad 491A. The second super-junction MOSFET 464 of the first group of super-junction MOSFETs 461 comprises a single gate pad 491B. The third super-junction MOSFET 466 of the first group of super-junction MOSFETs 461 comprises a single gate pad 491C. The first super-junction MOSFET 472 of the second group of super-junction MOSFETs 471 comprises a single gate pad 493A. The second super-junction MOSFET 474 of the second group of super-junction MOSFETs 471 comprises a single gate pad 493B. The third super-junction MOSFET 476 of the second group of super-junction MOSFETs 471 comprises a single gate pad 493C.

The IPM 400 comprises a first group of wires 401, a second group of wires 403, a third group of wires 411, and a fourth group of wires 413. Each wire in the groups of wires 401, 403, 411 and 413 may comprise a bond wire with a size ranging from 0.7 mil to 3 mils (17.8 microns to 76.2 microns), preferably, made from gold, copper or alumina.

The first group of wires 401 comprises a first wire 409A, a second wire 409B, and a third wire 409C. The first wire 409A connects a first pad of the low voltage IC 420 to the single gate pad 481A of the first IGBT 442 of the first group of IGBTs 441. The second wire 409B connects a second pad of the low voltage IC 420 to the single gate pad 481B of the second IGBT 444 of the first group of IGBTs 441. The third wire 409C connects a third pad of the low voltage IC 420 to the single gate pad 481C of the third IGBT 446 of the first group of IGBTs 441.

The second group of wires 403 comprises a first wire 404A, a second wire 404B, and a third wire 404C. The first wire 404A connects a first pad of the high voltage IC 422 to the single gate pad 483A of the first IGBT 452 of the second group of IGBTs 451. The second wire 404B connects a second pad of the high voltage IC 422 to the single gate pad 483B of the second IGBT 454 of the second group of IGBTs 451. The third wire 404C connects a third pad of the high voltage IC 422 to the single gate pad 483C of the third IGBT 456 of the second group of IGBTs 451.

The third group of wires 411 comprises a first wire 412A, a second wire 412B, and a third wire 412C. The first wire 412A connects the single gate pad 481A of the first IGBT 442 of the first group of IGBTs 441 to the single gate pad 491A of the first super-junction MOSFET 462 of the first group of super-junction MOSFETs 461. The second wire 412B connects the single gate pad 481B of the second IGBT 444 of the first group of IGBTs 441 to the single gate pad 491B of the second super-junction MOSFET 464 of the first group of super-junction MOSFETs 461. The third wire 412C connects the single gate pad 481C of the third IGBT 446 of the first group of IGBTs 441 to the single gate pad 491C of the third super-junction MOSFET 466 of the first group of super-junction MOSFETs 461.

The fourth group of wires 413 comprises a first wire 414A, a second wire 414B, and a third wire 414C. The first wire 414A connects the single gate pad 483A of the first IGBT 452 of the second group of IGBTs 451 to the single gate pad 493A of the first super-junction MOSFET 472 of the second group of super-junction MOSFETs 471. The second wire 414B connects the single gate pad 483B of the second IGBT 454 of the second group of IGBTs 451 to the single gate pad 493B of the second super-junction MOSFET 474 of the second group of super-junction MOSFETs 471. The third wire 414C connects the single gate pad 483C of the third IGBT 456 of the second group of IGBTs 451 to the single gate pad 493C of the third super-junction MOSFET 476 of the second group of super-junction MOSFETs 471.

The IPM 400 further comprises a plurality of connection members 415 each respectively connecting a top emitter electrode of each IGBT to a top source electrode of a corresponding super-junction MOSFET disposed on the same die supporting element. The connection member 415 has a size in a range between 5 mils to 20 mils (127 microns to 508 microns). Preferably, the size of connection member 415 is at least 5 times larger than the bond wire in the groups of wires 401, 403, 411 and 413.

Figure 5:
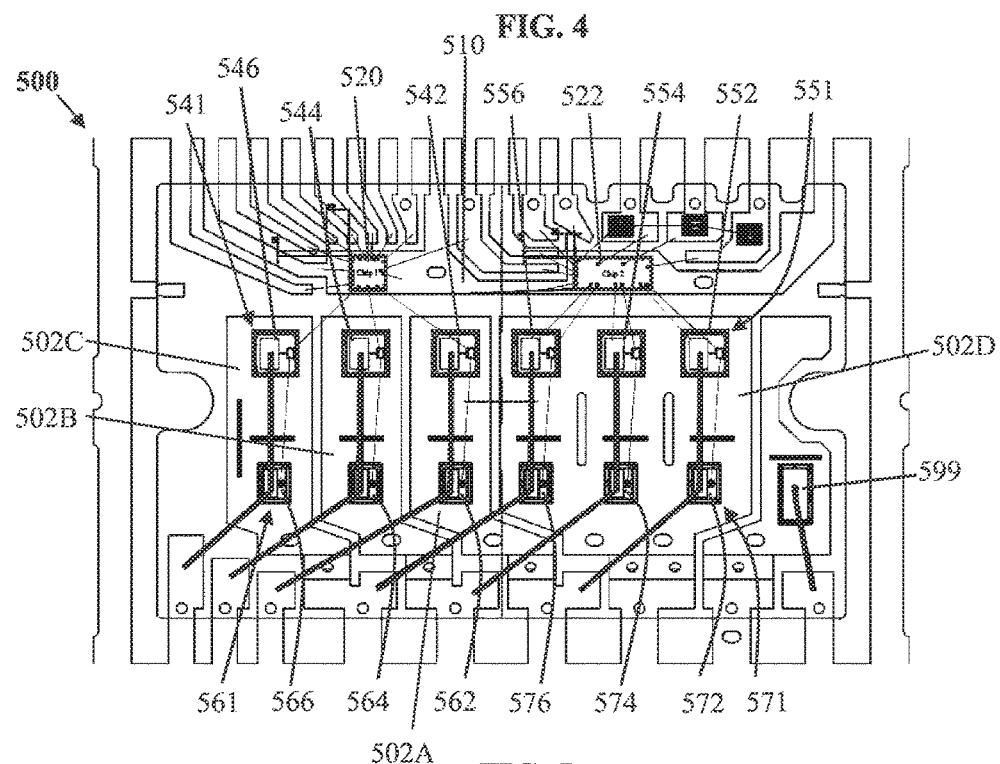
FIG. 5 is a top view of yet another IPM in examples of the present disclosure.

FIG. 5 is a top view of an IPM 500 in examples of the present disclosure. The IPM 500 has a die supporting element 502A, a die supporting element 502B, a die supporting element 502C, a die supporting element 502D, a die supporting element 502E, a die supporting element 510, a first group of IGBTs 541, a second group of IGBTs 551, a first group of super-junction MOSFETs 561, a second group of super-junction MOSFETs 571, a low voltage integrated circuit (IC) 520, a high voltage IC 522, and a power factor correction (PFC) diode 599. The die supporting elements 502A, 502B, 502C, 502D, 502E, and 510 are electrically isolated from each other.

The first group of IGBTs 541 comprises a first IGBT 542 attached to the die supporting element 502A, a second IGBT 544 attached to the die supporting element 502B, and a third IGBT 546 attached to the die supporting element 502C. The second group of IGBTs 551 comprises a first IGBT 552 attached to the die supporting element 502D, a second IGBT 554 attached to the die supporting element 102D, and a third IGBT 556 attached to the die supporting element 102D. The power factor correction (PFC) diode 599 attaches to the die supporting element 102E.

The first group of super-junction MOSFETs 561 comprises a first super-junction MOSFET 562 attached to the die supporting element 502A, a second super-junction MOSFET 564 attached to the die supporting element 502B, and a third super-junction MOSFET 566 attached to the die supporting element 502C. The second group of super-junction MOSFETs 571 comprises a first super-junction MOSFET 572 attached to the die supporting element 502D, a second super-junction MOSFET 574 attached to the die supporting element 502D, and a third super-junction MOSFET 576 attached to the die supporting element 502D. In a preferred example of the invention, each super-junction MOSFET of the first group of super-junction MOSFETs 561 is connected in parallel to a corresponding IGBT of the first group of IGBTs 541 disposed on a same die supporting element. In another preferred example of the invention, each super-junction MOSFET of the second group of super-junction MOSFETs 571 is connected in parallel to a corresponding IGBT of the second group of IGBTs 551 disposed on the same die supporting element.

The low voltage IC 520 is electrically connected to a gate of the first IGBT 542 of the first group of IGBTs 541, a gate of the second IGBT 544 of the first group of IGBTs 541, and a gate of the third IGBT 546 of the first group of IGBTs 541. The high voltage IC 522 is electrically connected to a gate of the first IGBT 552 of the second group of IGBTs 551, a gate of the second IGBT 554 of the second group of IGBTs 551, and a gate of the third IGBT 556 of the second group of IGBTs 551.

The low voltage IC 520 is disposed on the die supporting element 510 adjacent to die supporting elements 502A, 502B and 502C, and the high voltage IC 522 is disposed on the die supporting element 510 adjacent to die supporting elements 502D. In examples of the present disclosure, the low voltage IC 520 and the high voltage IC 522 are directly attached to the die supporting element 510. The IPM 500 is similar to the IPM 400 except the IPM 500 comprises the optional die supporting element 502E with the power factor correction (PFC) diode 599 disposed thereon. Electrodes of the power factor correction (PFC) diode 599 may be electrically isolated from the first and second groups of IGBTs and the low voltage IC 520 and the high voltage IC 522.

Figure 6:
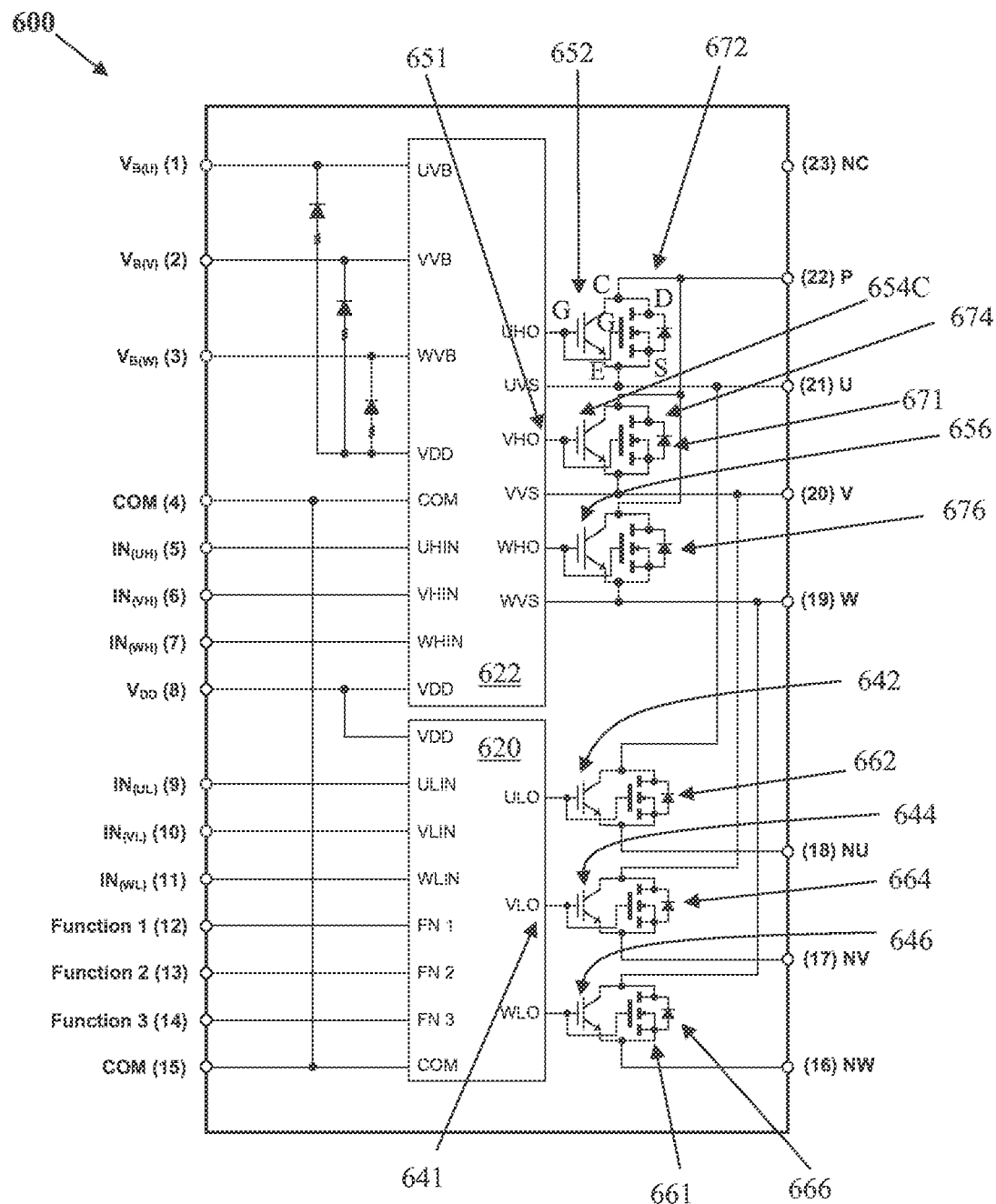
FIG. 6 is a circuit diagram of the IPM of FIG. 4 for driving a motor in examples of the present disclosure.

FIG. 6 is a circuit diagram 600 of the IPM 400 of FIG. 4 for driving a motor in examples of the present disclosure. It is a 3-phase, bootstrap circuit, inverter IPM including six gate driver channels for twelve active devices. A low voltage IC 620 controls a first IGBT 642 of the first group of IGBTs 641, a second IGBT 644 of the first group of IGBTs 641, and a third IGBT 646 of the first group of IGBTs 641. A high voltage IC 622 controls a first IGBT 652 of the second group of IGBTs 651, a second IGBT 654 of the second group of IGBTs 651, and a third IGBT 656 of the second group of IGBTs 651.

A drain electrode D of a first super-junction MOSFET 672 of the second group of super-junction MOSFETs 671, a drain electrode of a second super-junction MOSFET 674 of the second group of super-junction MOSFETs 671, and a drain electrode of a third super-junction MOSFET 676 of the second group of super-junction MOSFETs 671 are electrically connected. A drain electrode of a first super-junction MOSFET 662 of the first group of super-junction MOSFETs 661 is electrically connected to the source electrode of the first super-junction MOSFET 672 of the second group of super-junction MOSFETs 671. A drain electrode of a second super-junction MOSFET 664 of the first group of super-junction MOSFETs 661 is electrically connected to the source electrode of the second super-junction MOSFET 674 of the second group of super-junction MOSFETs 671. A drain electrode of a third super-junction MOSFET 666 of the first group of super-junction MOSFETs 661 is electrically connected to the source electrode of the third super-junction MOSFET 676 of the second group of super-junction MOSFETs 671.

A collector electrode of the first IGBT 642 of the first group of IGBTs 641 is electrically connected to a drain electrode of the first super-junction MOSFET 662 of the first group of super-junction MOSFETs 661. A collector electrode of the second IGBT 644 of the first group of IGBTs 641 is electrically connected to a drain electrode of the second super-junction MOSFET 664 of the first group of super-junction MOSFETs 661. A collector electrode of the third IGBT 646 of the first group of IGBTs 641 is electrically connected to a drain electrode of the third super-junction MOSFET 666 of the first group of super-junction MOSFETs 661.

A collector electrode of the first IGBT 652 of the second group of IGBTs 651 is electrically connected to a drain electrode of the first super-junction MOSFET 672 of the second group of super-junction MOSFETs 671. A collector electrode of the second IGBT 654 of the second group of IGBTs 651 is electrically connected to a drain electrode of the second super-junction MOSFET 674 of the second group of super-junction MOSFETs 671. A collector electrode of the third IGBT 656 of the second group of IGBTs 651 is electrically connected to a drain electrode of the third super-junction MOSFET 676 of the second group of super-junction MOSFETs 671.

An emitter electrode of the first IGBT 642 of the first group of IGBTs 641 is electrically connected to a source electrode of the first super-junction MOSFET 662 of the first group of super-junction MOSFETs 661. An emitter electrode of the second IGBT 644 of the first group of IGBTs 641 is electrically connected to a source electrode of the second super-junction MOSFET 664 of the first group of super-junction MOSFETs 661. An emitter electrode of the third IGBT 646 of the first group of IGBTs 641 is electrically connected to a source electrode of the third super-junction MOSFET 666 of the first group of super-junction MOSFETs 661.

An emitter electrode of the first IGBT 652 of the second group of IGBTs 651 is electrically connected to a source electrode of the first super-junction MOSFET 672 of the second group of super-junction MOSFETs 671. An emitter electrode of the second IGBT 654 of the second group of IGBTs 651 is electrically connected to a source electrode of the second super-junction MOSFET 674 of the second group of super-junction MOSFETs 671. An emitter electrode of the third IGBT 656 of the second group of IGBTs 651 is electrically connected to a source electrode of the third super-junction MOSFET 676 of the second group of super-junction MOSFETs 671.

Figure 7:
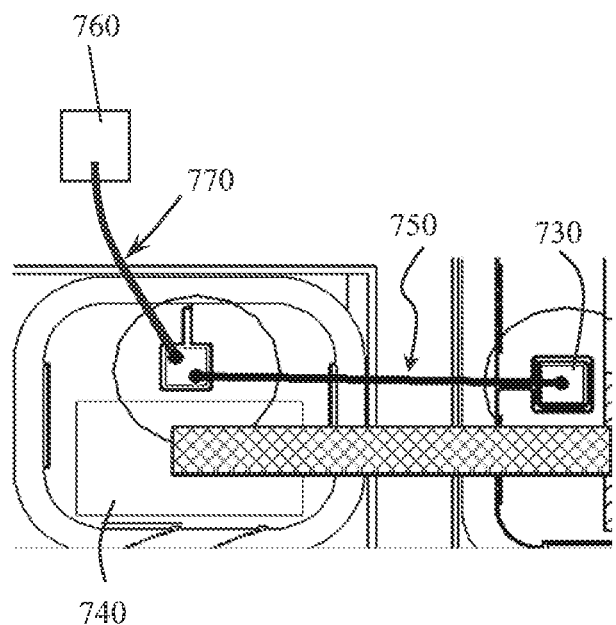
FIG. 7 is a top view of a ball stitch on ball (BSOB) method for wire bonding in examples of the present disclosure.

FIG. 7A is a top view of a ball stitch on ball (BSOB) method for wire bonding in examples of the present disclosure. A first wire 750 electrically and mechanically connects a first device 730 to a second device 740. A second wire 770 electrically and mechanically connects the second device 740 to a lead 760.

In examples of the present disclosure, each wire of the first group of wires 401 of FIG. 4 and a respective wire of the third group of wires 411 of FIG. 4 are connected by the BSOB method. Each wire of the second group of wires 403 of FIG. 4 and a respective wire of the fourth group of wires 413 of FIG. 4 are connected by the BSOB method.

Figure 8:
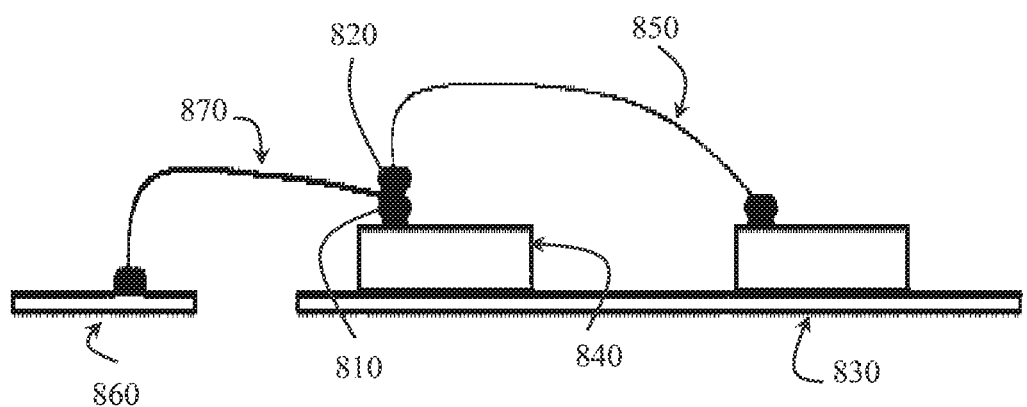
FIG. 8 is a side view of a bridge bonding method for wire bonding in examples of the present disclosure.

FIG. 8 is a side view of a bridge bonding method for wire bonding in examples of the present disclosure. A second bonding ball 820 is directly stacked on top of a first bonding ball 810. A first wire 870 electrically connects a first device 840 to a lead 860. A second wire 850 electrically connects a second device 830 to the first device 840.

In examples of the present disclosure, each wire of the first group of wires 401 of FIG. 4 and a respective wire of the third group of wires 411 of FIG. 4 are connected by the bridge bonding method. Each wire of the second group of wires 403 of FIG. 4 and a respective wire of the fourth group of wires 413 of FIG. 4 are connected by the bridge bonding method.

Those of ordinary skill in the art may recognize that modifications of the embodiments disclosed herein are possible. For example, a total number of IGBTs attached to fourth die supporting element may vary. Other modifications may occur to those of ordinary skill in this art, and all such modifications are deemed to fall within the purview of the present invention, as defined by the claims.

The invention claimed is:

1. An intelligent power module (IPM) for driving a motor, the IPM comprising:
    a first, second, third and fourth die supporting elements separating from one another;
    a first group of insulated gate bipolar transistors (IGBTs) comprising
        a first IGBT attached to the third die supporting element; and
        a second IGBT attached to the fourth die supporting element;
    a second group of IGBTs comprising
        a first IGBT attached to the second die supporting element; and
        a second IGBT attached to the second die supporting element;
    a first group of super-junction metal-oxide-semiconductor field-effect transistors (MOSFETs) comprising
        a first super-junction MOSFET attached to the third die supporting element; and
        a second super-junction MOSFET attached to the fourth die supporting element;
    a second group of super-junction MOSFETs comprising
        a first super-junction MOSFET attached to the second die supporting element; and
        a second super-junction MOSFET attached to the second die supporting element;
    a low voltage integrated circuit (IC) attached to the first die supporting element; the low voltage IC being electrically connected to the first IGBT of the first group of IGBTs and the second IGBT of the first group of IGBTs;
    a high voltage IC attached to the first die supporting element, the high voltage IC being electrically connected to the first IGBT of the second group of IGBTs and the second IGBT of the second group of IGBTs; and
    a molding encapsulation enclosing the first, second, third, and fourth die supporting elements, the first group of IGBTs, the second group of IGBTs, the first group of super-junction MOSFETs, the second group of super-junction MOSFETs, the low voltage IC, and the high voltage IC.

2. The IPM of claim 1, wherein each IGBT of the first group of IGBTs comprises a bottom collector electrode conductively attached to a corresponding die supporting element;
    wherein each IGBT of the second group of IGBTs comprises a bottom collector electrode conductively attached to the second die supporting element;
    wherein each super-junction MOSFET of the first group of super-junction MOSFETs comprises a bottom drain electrode conductively attached to a corresponding die supporting element; and
    wherein each super-junction MOSFET of the second group of super-junction MOSFETs comprises a bottom drain electrode conductively attached to the second die supporting element.

3. The IPM of claim 2 further comprising an additional die supporting element separated from the first, second, third and fourth die supporting elements; and wherein no IGBTs nor super-junction MOSFETs are attached to the additional die supporting element.

4. The IPM of claim 2 further comprising a fifth die supporting element separated from the first, second, third and fourth die supporting elements;
   wherein the molding encapsulation encloses the fifth die supporting element;
   wherein the first group of IGBTs further comprises a third IGBT attached to the fifth die supporting element;
   wherein the second group of IGBTs further comprises a third IGBT attached to the second die supporting element;
   wherein the first group of super-junction MOSFETs further comprises a third super-junction MOSFET attached to the fifth die supporting element; and
   wherein the second group of super-junction MOSFETs further comprises a third super-junction MOSFET attached to the second die supporting element.

5. The IPM of claim 4, wherein the low voltage IC is electrically connected to the third IGBT of the first group of IGBTs; and
   wherein the high voltage IC is electrically connected to the third IGBT of the second group of IGBTs.

6. The IPM of claim 4, wherein each of the IGBT of the first and second groups of IGBTs comprises a single gate pad; and wherein each of the super-junction MOSFET of the first and second groups of super-junction MOSFET s comprises a single gate pad.

7. The IPM of claim 6 further comprising a first group of wires, a second group of wires, a third group of wires, and a fourth group of wires;
   wherein each of the first group of wires connects a corresponding pad of the low voltage IC to the single gate pad of a corresponding IGBT of the first group of IGBTs;
   wherein each of the second group of wires connects a corresponding pad of the high voltage IC to the single gate pad of a corresponding IGBT of the second group of IGBTs;
   wherein each of the third group of wires connects the single gate pad of a corresponding IGBT of the first group of IGBTs to the single gate pad of a corresponding super-junction MOSFET of the first group of super-junction MOSFETs, the corresponding IGBT and the corresponding super-junction MOSFET being disposed on a same die supporting element; and
   wherein each of the fourth group of wires connects the single gate pad of a corresponding IGBT of the second group of IGBTs to the single gate pad of a corresponding super-junction MOSFET of the second group of super-junction MOSFETs.

8. The IPM of claim 7, wherein each wire of the first group of wires and a respective wire of the third group of wires are connected by a ball stitch on ball (BSOB) method; and
   wherein each wire of the second group of wires and a respective wire of the fourth group of wires are connected by the BSOB method.

9. The IPM of claim 7, wherein each wire of the first group of wires and a respective wire of the third group of wires are connected by a bridge bonding method so that a second bonding ball is directly stacked on top of a first bonding ball; and
   wherein each wire of the second group of wires and a respective wire of the fourth group of wires are connected by the bridge bonding method so that a fourth bonding ball is directly stacked on top of a third bonding ball.

10. The IPM of claim 7, wherein each wire in the first, second, third and fourth groups of wires comprises a bond wire with a size ranging from 17.8 microns to 76.2 microns.

11. The IPM of claim 10, wherein an emitter electrode of each IGBT of the first group of IGBTs is electrically connected through a corresponding connection member to a source electrode of a corresponding super-junction MOSFET of the first group of super-junction MOSFETs disposed on a same die supporting element; and
   wherein an emitter electrode of each IGBT of the second groups of IGBTs is electrically connected through a corresponding connection member to a source electrode of a corresponding super-junction MOSFET of the second group of super-junction MOSFETs.

12. The IPM of claim 11, wherein a size of the corresponding connection member is at least five times larger than the bond wire.

13. The IPM of claim 12, wherein the bottom drain electrode of the first super-junction MOSFET of the first group of super-junction MOSFETs is electrically connected to the emitter electrode of the first IGBT of the second group of IGBTs;
   wherein the bottom drain electrode of the second super-junction MOSFET of the first group of super-junction MOSFETs is electrically connected to the emitter electrode of the second IGBT of the second group of IGBTs;
   wherein the bottom drain electrode of the third super-junction MOSFET of the first group of super-junction MOSFETs is electrically connected to the emitter electrode of the third IGBT of the second group of IGBTs.

14. An intelligent power module (IPM) for driving a motor, the IPM comprising:
   a plurality of die supporting elements separating from one another;
   a first group of insulated gate bipolar transistors (IGBTs) comprising two or more IGBTs each attached to a different die supporting element of the plurality of die supporting elements;
   a second group of IGBTs comprising two or more IGBTs each attached to a same die supporting element of the plurality of die supporting elements;
   a first group of super-junction metal-oxide-semiconductor field-effect transistors (MOSFETs) comprising two or more super-junction MOSFETs each connected in parallel to a respective IGBT of the first group of IGBTs;
   a second group of super-junction MOSFETs comprising two or more super-junction MOSFETs each connected in parallel to a respective IGBT of the second group of IGBTs;
   a low voltage integrated circuit (IC) electrically connected to each IGBT of the first group of IGBTs;
   a high voltage IC electrically connected to each IGBT of the second group of IGBTs; and
   a molding encapsulation enclosing the plurality of die supporting elements, the first group of IGBTs, the second group of IGBTs, the first group of super-junction MOSFETs, the second group of super-junction MOSFETs, the low voltage IC, and the high voltage IC.

15. The IPM of claim 14, wherein each IGBT of the first group of IGBTs comprises a bottom collector electrode conductively attached to a corresponding die supporting element;
   wherein each IGBT of the second group of IGBTs comprises a bottom collector electrode conductively attached to the same die supporting element;

wherein each super-junction MOSFET of the first group of super-junction MOSFETs comprises a bottom drain electrode conductively attached to a corresponding die supporting element; and wherein each super-junction MOSFET of the second group of super-junction MOSFETs comprises a bottom drain electrode conductively attached to the same die supporting element.

16. The IPM of claim 14, wherein each of the IGBT of the first and second groups of IGBTs comprises a single gate pad; and wherein each of the super-junction MOSFET of the first and second groups of super-junction MOSFET s comprises a single gate pad.

17. The IPM of claim 16, wherein the single gate pad of each IGBT is electrically connected by a wire to the single gate pad of a corresponding super-junction MOSFET connected in parallel to said each IGBT.

18. The IPM of claim 17, wherein the wire comprising a bond wire with a size ranging from 17.8 microns to 76.2 microns.

19. The IPM of claim 18, wherein an emitter electrode of each IGBT of the first and second groups of IGBTs is electrically connected through a corresponding connection member to a source electrode of a corresponding super-junction MOSFET of the first and second groups of super-junction MOSFETs connected in parallel to said each IGBT.

20. The IPM of claim 19, wherein a size of the corresponding connection member is at least five times larger than the bond wire.

* * * * *